United States Patent [19]

Shirakawa et al.

[11] Patent Number: 5,680,316
[45] Date of Patent: Oct. 21, 1997

[54] METHOD FOR ESTIMATING DISCHARGE CAPABILITY OF ZINC OXIDE POWER ELEMENT, METHOD FOR SCREENING THE ELEMENT AND SYSTEMS FOR CARRYING OUT THESE METHODS

[75] Inventors: Shingo Shirakawa; Shirou Murosawa, both of Hitachi, Japan

[73] Assignee: Hitachi, Ltd., Tokyo, Japan

[21] Appl. No.: 640,093

[22] Filed: Apr. 30, 1996

[30] Foreign Application Priority Data

May 11, 1995 [JP] Japan ................... 7-113345

[51] Int. Cl.$^6$ ............................................. G01R 31/02
[52] U.S. Cl. .................... 364/480; 324/500; 324/451; 338/21; 338/13; 361/117; 361/127
[58] Field of Search ............................... 364/480, 481, 364/550, 551.01, 552, 264; 338/20, 21, 22 R, 23, 24, 13–15, 17; 361/117, 126–128; 374/102, 104, 112, 137; 324/451, 501; 430/964

[56] References Cited

U.S. PATENT DOCUMENTS

| | | | |
|---|---|---|---|
| 4,112,362 | 9/1978 | Hower et al. | 324/719 |
| 4,733,175 | 3/1988 | Levinson | 324/500 |
| 4,737,917 | 4/1988 | Perron | 364/475.1 |
| 5,264,819 | 11/1993 | Nied et al. | 338/21 |
| 5,552,575 | 9/1996 | Doumanidis | 219/124.34 |
| 5,592,140 | 1/1997 | Tokunaga et al. | 338/21 |

FOREIGN PATENT DOCUMENTS

62-179701  8/1987  Japan .

*Primary Examiner*—James P. Trammell
*Assistant Examiner*—Tuan Q. Dam
*Attorney, Agent, or Firm*—Fay, Sharpe, Beall, Fagan, Minnich & McKee

[57] ABSTRACT

The discharge capability of zinc oxide elements is determined. A current of a given energy quantity is allowed to flow through a zinc oxide element to generate heat. The element is photographed by a camera and the temperature distribution of the element is obtained from the photographed image. The maximum temperature and the minimum temperature are determined and simultaneously the distance l between the points which show both the temperatures is determined. The difference ΔT between the maximum temperature and the minimum temperature is divided by the distance l to obtain an index ΔT/l. The relation between the index and the discharge capability is previously obtained and this relation is stored in a memory. Using the stored relation, a discharge capability corresponding to the obtained index is obtained.

11 Claims, 11 Drawing Sheets

METHOD FOR ESTIMATING DISCHARGE CAPABILITY OF ZINC OXIDE POWER ELEMENT, METHOD FOR SCREENING THE ELEMENT AND SYSTEMS FOR CARRYING OUT THESE METHODS

BACKGROUND OF THE INVENTION

1. Field of the Invention

The present invention relates to a method of estimating the discharging capability of a zinc oxide element for electric power used as a resistor of an apparatus for protection from overvoltage, a method of screening the element, and systems for carrying out these methods.

2. Description of Prior Art

Power elements mainly composed of zinc oxide are used as a non-linear resistor in a power apparatus for protection from overvoltage.

The discharge capability of the zinc oxide element against TOV (temporary overvoltage) was 125 $J/cm^3$ in 60 kV lightning arrestors early in 1975 and changed to 250 $J/cm^3$ in 500 kV high-performance lightning arrestors in the middle of 1985. In the near future, a discharge capability of more than 300 $J/cm^3$ will be expected in 1000 kV lightning arrestors. For 1000 kV lightning arrestors, it is planned to use high-performance zinc oxide elements with 4 of them being arranged in parallel and 294 of them being arranged in series, and the discharge capability of each of these elements will be a very important factor.

The zinc oxide element is prepared by mixing zinc oxide as a main component with a small amount of oxides of bismuth, antimony, cobalt, manganese, chromium and the like, granulating the mixture, molding the granule, firing the molded product at high temperatures in the air, and providing the resulting sintered body with metal electrodes by flame spraying aluminum. This zinc oxide element is very excellent in the non-linear voltage-current characteristic, and this excellent characteristic is considered to be caused by the interface between low resistance ZnO particles of about 10 μm in diameter and a high resistance oxide layer (interfacial layer) mainly composed of additives such as $Bi_2O_3$ having a particle size of about 0.1 μm. However, as mentioned above, since the zinc oxide element is prepared by adding fine powders of many metal oxides to zinc oxide and sintering the mixture, the fine structure is apt to become non-uniform. Therefore, when a stress is applied thereto at the time of passing the current, fluctuation in the discharge capability readily occurs for the respective zinc oxide elements.

There are basic non-destructive inspection methods to ascertain the discharge capability of a zinc oxide element, for example, by a supersonic flaw detection method, an X-ray photography method, or an energy injection method which actually carries out the passing of electric current.

Of these methods, the energy injection method is disclosed in JP-A-62-179701. According to this method, the temperature distribution pattern on the surface of an acceptable (good) zinc oxide element in allowing current to flow therethrough is previously obtained, and then an element to be screened is applied with a current energy of less than ⅓ of the critical value of the discharge capability thereof to obtain a temperature distribution pattern of the element, and the thus obtained temperature distribution pattern on the surface of the element is compared with the previously obtained temperature distribution pattern of the acceptable zinc oxide element, thereby to judge the acceptable(good)/unacceptable(bad) state or quality of the zinc oxide element to be screened.

According to the non-destructive inspection methods such as supersonic flaw detection or X-ray photography, large voids or cracks inside the element can be recognized, but small voids are apt to be overlooked and, furthermore, the deviation of the component distribution can hardly be found. Therefore, the discharge capability of the zinc oxide element to be screened cannot be determined as well as the acceptable/unacceptable state of the zinc oxide element cannot be accurately be judged.

Moreover, according to the method disclosed in JP-A-62-179701, the judgement of the quality is made by comparing the temperature distribution patterns, which is accurate to some extent. However, the discharge capability of the element to be screened cannot be numerically obtained and a final judgement of the quality cannot be accurately performed.

SUMMARY OF THE INVENTION

The object of the present invention is to provide a method of numerically estimating the discharge capability of zinc oxide elements to be screened, a method of screening zinc oxide elements, by which the quality of zinc oxide elements is accurately judged from the estimated discharge capability, and apparatuses for carrying out these methods.

DETAILED DESCRIPTION OF PREFERRED EMBODIMENTS

The method of estimating the discharge capability of a zinc oxide element according to the present invention to attain the above object comprises:

previously determining the relation between the discharge capability of the zinc oxide element and the value (hereinafter referred to as an "index") obtained by dividing a difference between the maximum temperature and the minimum temperature which the zinc oxide element reached under heating when a current of a given energy quantity was allowed to flow therethrough, by a distance between the maximum temperature point and the minimum temperature point of the element, allowing a current of said given energy quantity to flow through the zinc oxide element, determining the maximum temperature and the minimum temperature on the surface of the zinc oxide element heated by allowing the current to flow therethrough and concurrently determining the distance between the maximum temperature point and the minimum temperature point of the element, calculating said index by dividing the difference between the obtained maximum and minimum temperatures by the determined distance, and obtaining the discharge capability from the calculated index and the previously obtained relation.

The index used herein may be a ratio of the maximum temperature and the minimum temperature. In this case, it is necessary to previously determine the relation between the maximum temperature/minimum temperature ratio and the discharge capability of the zinc oxide element.

The method of screening zinc oxide elements according to the present invention to attain the above object comprises:

estimating the discharge capability of the zinc oxide element by the above-mentioned estimating method, allowing a nominal discharge current to flow through the zinc oxide element, which current is required by the element as a resistor of a lightning arrestor, while measuring the voltage applied to the element (hereinafter referred to as "limit voltage"), determining the voltage (hereinafter referred to as "operating voltage") applied to the zinc oxide element when a previously given small current is allowed to flow through the zinc oxide element, and judging the zinc oxide element as being proper for a resistor of the lightning arrestor, when the estimated discharge capability is greater than the previously determined discharge capability, the determined limit voltage is lower than the previously determined limit voltage, and the determined operating voltage is higher than the previously determined operating voltage.

In this method of screening a zinc oxide element, it is preferred to determine the limit voltage after the maximum temperature and the minimum temperature were determined on the surface of the zinc oxide element by allowing a current of a given energy quantity to flow through the zinc oxide element and, thereafter, determine the operating voltage.

One of the systems for estimating the discharge capability of a zinc oxide element according to the present invention comprises:

an energy injection means for allowing a current of a given energy quantity to flow through the zinc oxide element, a photographing means for taking a photograph of the zinc oxide element heated by allowing the current to flow therethrough, a temperature distribution-computing means for obtaining the surface temperature distribution of the zinc oxide element from the photograph image of the zinc oxide element by the photographing means, a maximum and minimum temperature-determining means for determining the maximum temperature and the minimum temperature of the temperatures of various parts of the zinc oxide element from the temperature distribution-computing means, a distance-determining means for determining the distance between the maximum temperature point and the minimum temperature point, an index-computing means for obtaining a value (hereinafter referred to as an "index") obtained by dividing a difference between the maximum temperature and the minimum temperature determined by the maximum and minimum temperature-determining means by a distance determined by the distance-determining means, a memory means for storing the relation between the discharge capability of the zinc oxide element and the value (index) obtained by dividing the difference between the maximum temperature and the minimum temperature of the zinc oxide element heated by allowing said current of a given energy quantity to flow therethrough, by the distance between the maximum temperature point and the minimum temperature point, and a discharge capability-estimating means for obtaining the discharge capability corresponding to the index obtained by the index-computing means using the relation memorized in the memory means.

Another system for estimating the discharge capability of a zinc oxide element according to the present invention comprises:

an energy injection means for allowing a current of a given energy quantity to flow through the zinc oxide element, a photographing means for taking a photograph of the zinc oxide element heated by allowing the current to flow therethrough, a temperature distribution-computing means for obtaining the surface temperature distribution of the zinc oxide element from the photograph image of the zinc oxide element from the photographing means, a maximum temperature and minimum temperature-determining means for determining the maximum temperature and the minimum temperature of the temperatures of various parts of the zinc oxide element which are obtained by the temperature distribution-computing means, a distance-determining means for determining the distance between the maximum temperature point and the minimum temperature point, an index-computing means for obtaining a ratio (hereinafter referred to as "index") of the maximum temperature and the minimum temperature from the maximum and minimum temperatures-determining means, a memory means for storing the relation between the discharge capability of the zinc oxide element and the ratio (index) of the maximum temperature and the minimum temperature of the zinc oxide element heated by allowing said current of a given energy quantity to flow therethrough, and an discharge capability-estimating means for obtaining the discharge capability corresponding to the index obtained by the index-computing means using the relation memorized in the memory means.

Furthermore, the system for screening a zinc oxide element of the present invention for attaining the above object comprises:

one of the above-mentioned systems for estimating the discharge capability, a limit voltage-determining means for determining a voltage (hereinafter referred to as "limit voltage") applied to the zinc oxide element in allowing a nominal discharge current required for the zinc oxide element as a resistor of a lightning arrestor to flow through the zinc oxide element, an operating voltage-determining means for determining a voltage (hereinafter referred to as "operating voltage") applied to the zinc oxide element in allowing a previously given small current to flow therethrough, a discharge capability-evaluating means for judging the zinc oxide element to be acceptable or unacceptable with respect to the discharge capability by observing whether the discharge capability estimated by the discharge capability-estimating system is greater than the previously determined discharge capability, a limit voltage-evaluating means for judging the zinc oxide element to be acceptable or unacceptable with respect to the limit voltage by observing whether the limit voltage determined by the limit voltage-determining means is lower than the previously determined limit voltage, an operating voltage-evaluating means for judging the zinc oxide element to be acceptable or unacceptable with respect to the operating voltage by observing whether the operating voltage measured by the operating voltage-determining means is higher than the previously determined operating voltage, and an integrated evaluation means for judging the zinc oxide element to be proper as a resistor of lightning arrestor only when the zinc oxide element is judged to be acceptable by each of the above-mentioned evaluation means.

This screening system is preferably provided with a marking device for marking the zinc oxide element judged to be proper as a resistor of the lightning arrestor by the integrated evaluation means. Furthermore, it is preferably provided with a carrying device for carrying the zinc oxide element through the discharge capability-estimating means, the limit voltage-determining means and the operating voltage-determining means in this order.

When a current of a given energy quantity is allowed to flow through a zinc oxide element, the temperature of the zinc oxide element naturally rises in incrementally corresponding to the energy quantity. Thus, the surface temperature distribution of the zinc oxide element heated by the injection of a given energy has a certain correlation with the discharge capability of the zinc oxide element. More specifically, the value obtained by dividing the difference between the maximum temperature and the minimum temperature of the surface of the zinc oxide element heated, by the distance between the maximum temperature point and the minimum temperature point has a certain correlation with the discharge capability of the zinc oxide element. Moreover, the ratio of the maximum temperature and the minimum temperature of the surface of the zinc oxide element heated also has a certain correlation with the discharge capability of the zinc oxide element.

Therefore, the relation between the discharge capability and the above-mentioned value as the index is previously obtained and a current of a given energy quantity is actually allowed to flow through the zinc oxide element, and the index of the zinc oxide element heated by allowing the current to flow is obtained. Using this index and the previously obtained correlation, the discharge capability of the zinc oxide element can be numerically obtained.

Accordingly, the quality (good or bad, namely, acceptable or unacceptable) of the zinc oxide element can accurately be judged since the discharge capability is clearly numerically expressed as mentioned above.

For the judgement of whether or not a zinc oxide element is proper as a resistor of lightning arrestors, in addition to the above judgement on the discharge capability, it is necessary to make a judgement also on the limit voltage and operating voltage.

Since the zinc oxide element has a property of its resistivity decreasing with an increase in its temperature, the operating voltage of the zinc oxide element determined under the condition of the temperature rising upon application of a given energy, is lower than under the condition of no temperature rising. Therefore, when the operating voltage of the element is determined after the element has heated, the operating voltage can be evaluated under more severe conditions. The determination of the operating voltage of the element is carried out by allowing a micro-current to flow therethrough, and so is more delicate a determination as compared with the other determinations. Therefore, when micro-cracks occur in the element in the determination of the discharge capability or limit voltage which is carried out by applying a relatively large energy to the element, these cracks affect the operating voltage. Accordingly, even if cracks have occurred at the determination of the discharge capability or the limit voltage, these cracks can be recognized by carrying out the determination of the operating voltage after the determination of the discharge capability and limit voltage.

One example of the system for screening zinc oxide elements according to the present invention will be illustrated below referring to the drawings.

Figure 1:
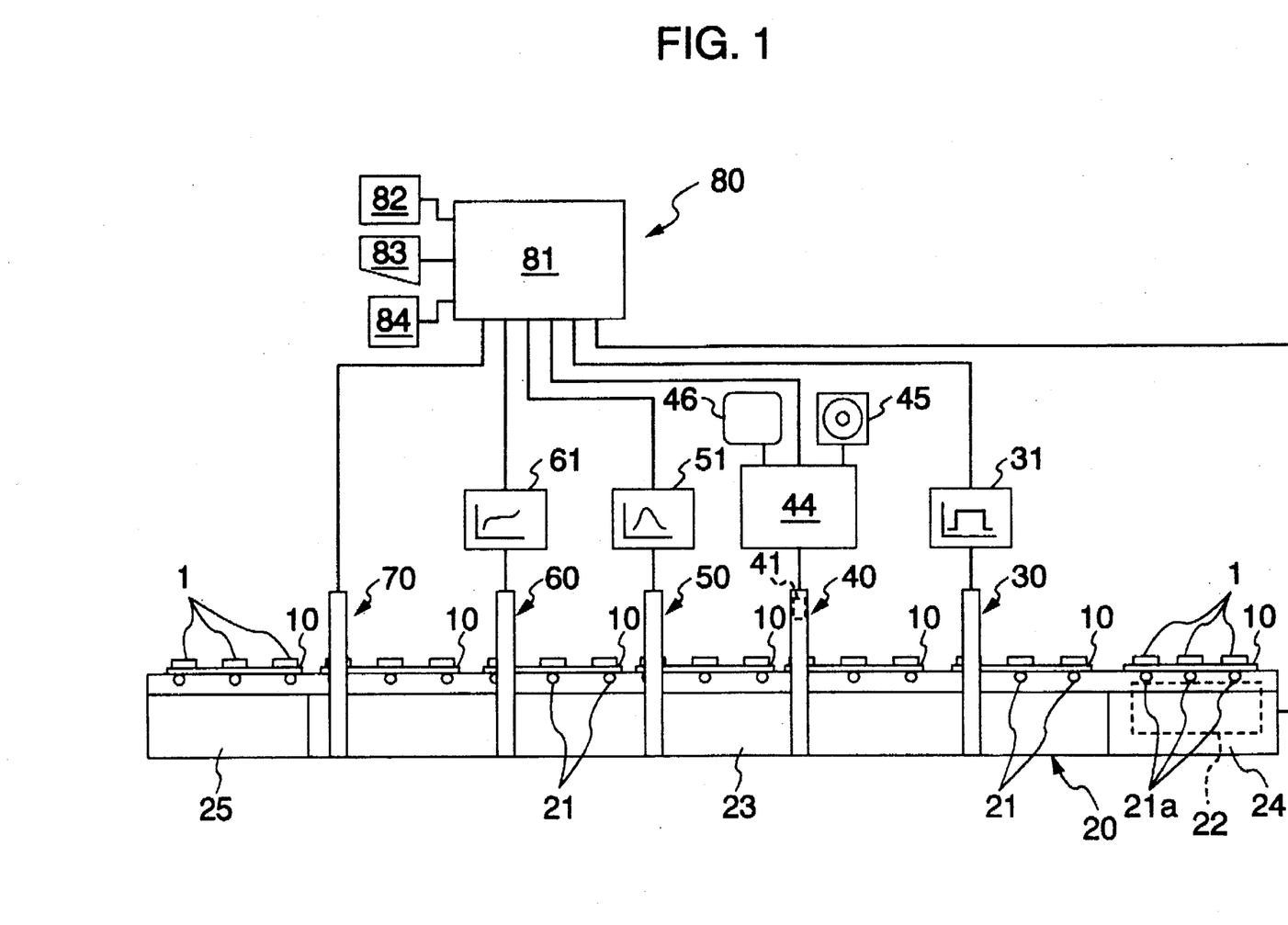
FIG. 1 is a diagram showing the structure of a zinc oxide element-screening system according to one example of the present invention.

As shown in FIG. 1, the screening apparatus of this example includes pallets 10 on which zinc oxide elements 1 are mounted, a carrying device 20 which carries the pallets 10 on which the zinc oxide elements 1 are mounted, a rectangular wave current applying device (energy injection means) 30 which allows a rectangular wave current to flow through the zinc oxide elements 1 carried with being mounted on the pallet 10, a discharge capability-estimating device 40 which takes a photograph of the surface of the zinc oxide element 1 through which the rectangular wave current was allowed to flow by the rectangular wave current-applying device 30 and estimates the discharge capability of the zinc oxide element 1 from the resulting image, a limit voltage-determining device 50 which allows a lightning impulse current to flow through the zinc oxide element 1 and determines the limit voltage at that time, an operating voltage-determining device 60 which allows a small direct current to flow through the zinc oxide element 1 and determines the operating voltage at that time, a production number-marking device 70 which marks a production number on the element 1 judged as being acceptable, and a control device 80 which controls the respective devices and judges the quality of zinc oxide element 1 on the basis of the data from the respective devices.

Figure 2:
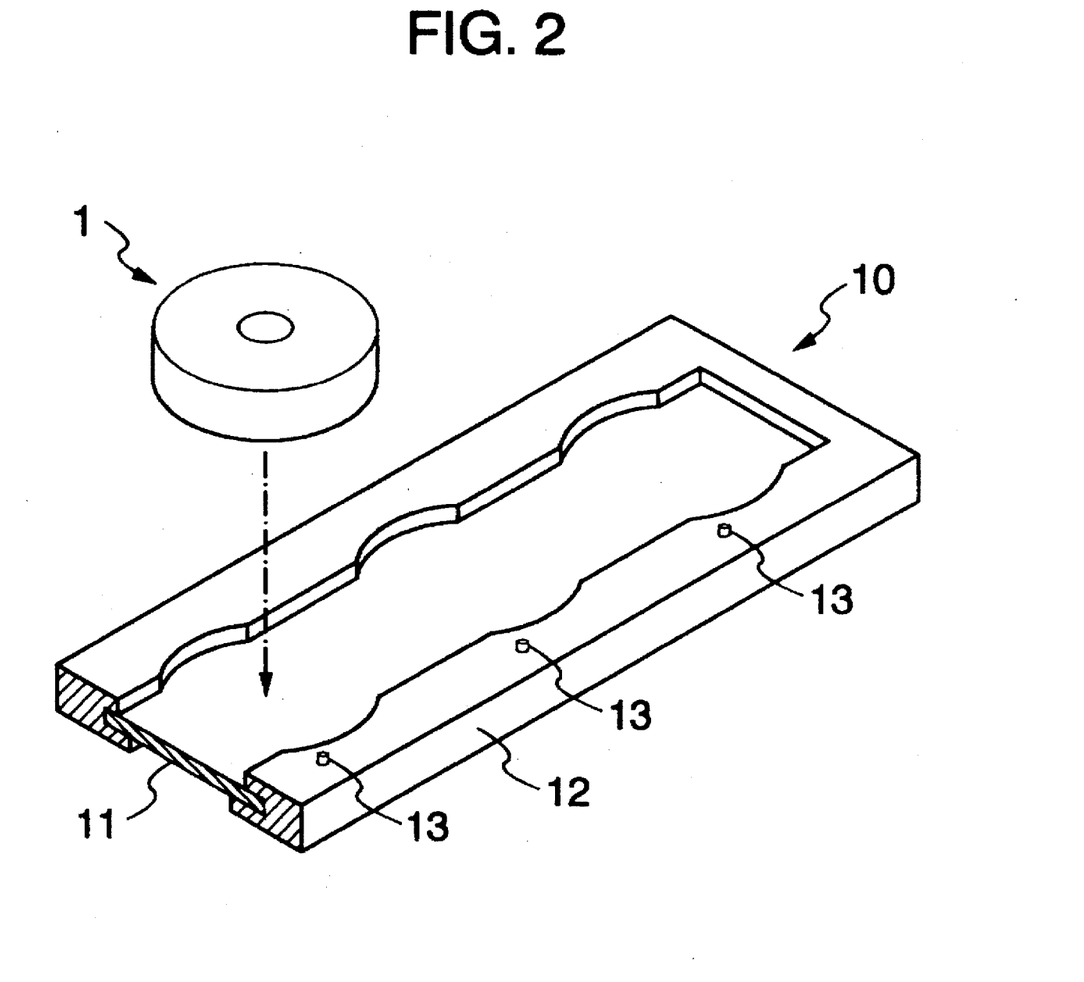
FIG. 2 is an oblique view of a pellet of a zinc oxide element-screening system according to one example of the present invention.

As Shown in FIG. 2, pallet 10 has a metal plate 11 on which three zinc oxide elements 1, 1, 1 can be mounted, an insulation pallet frame 12 which covers the metal plate 11, and pins 13, 13, 13 which inform of the presence of the zinc oxide elements 1, 1, 1 on the metal plate 11. The side of the metal plate 11 is covered with the insulation pallet frame 12 and the top surface and the bottom surface of the plate are exposed. In this example, considering the handling of elements 1, three elements can be mounted on pallet 10, but the number of the elements mounted on the pallet may be one or more than 3.

Figure 3:
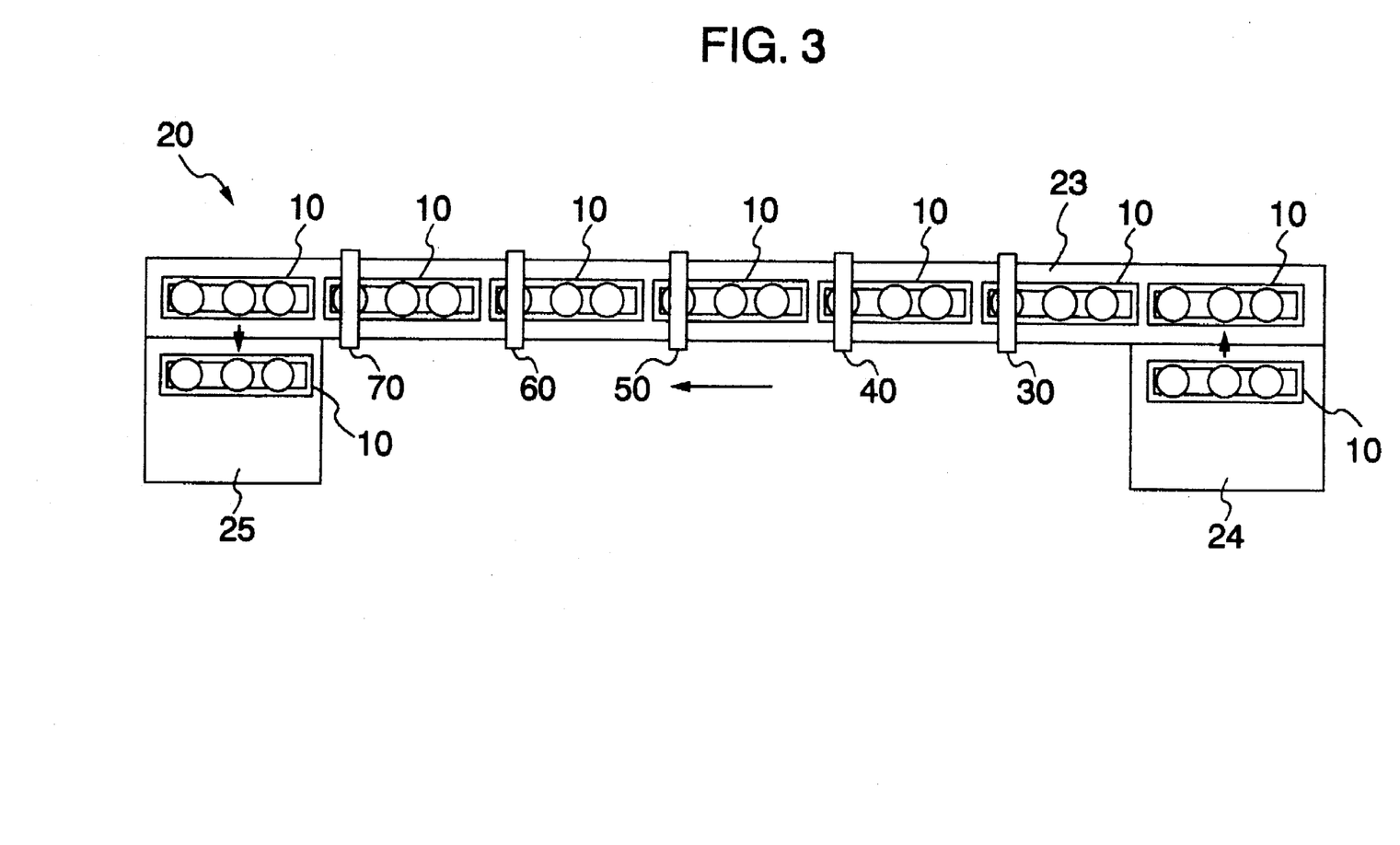
FIG. 3 is a top view of a carrying device of the zinc oxide element-screening system according to one example of the present invention.

As shown in FIG. 1 and in FIG. 3, the carrying device 20 has a plurality of rollers 21, 21, - - - provided along a linear carrying route, a roller-driving mechanism 22 which rotates some rollers 21a, 21a, 21a at the beginning part of the plurality of the rollers 21, 21, - - -, a base 23 on which these pallets are mounted, a delivery table 24 which has the pallets 10 having the zinc oxide elements 1 thereon and delivers the pallets 10 to the beginning part of the carrying route, and a receiving table 25 which receives the pallets 10 having the zinc oxide elements 1 thereon from the terminal part of the carrying route.

A rectangular wave current-applying device 30, a discharge capability-estimating device 40, a limit voltage-determining device 50, an operating voltage-determining device 60 and a production number-marking device 70 are arranged in this order along the carrying route of the carrying device 20.

Figure 4:
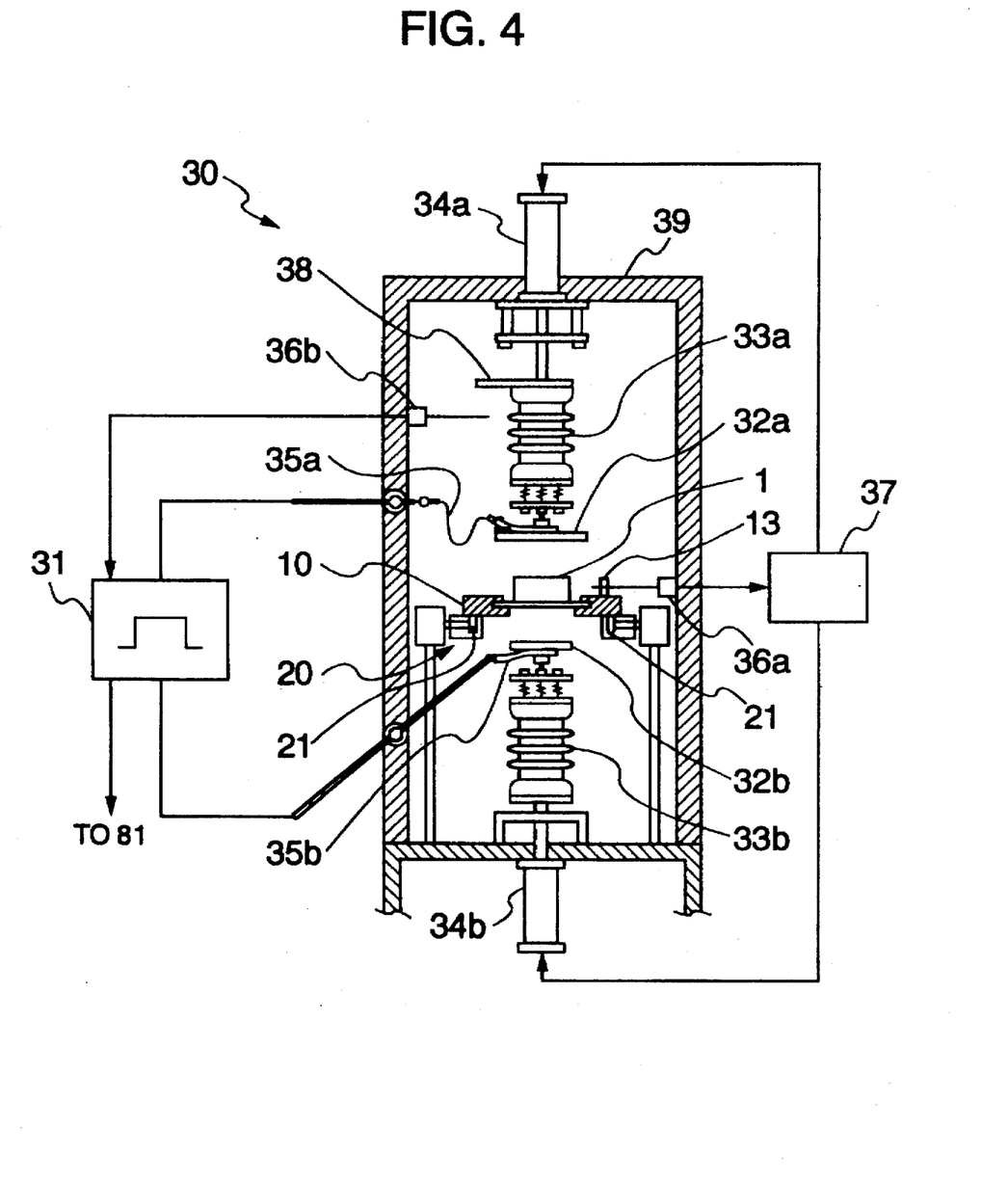
FIG. 4 is a side view of a rectangular wave-flowing device (open state) of the zinc oxide element screening system according to one example of the present invention.

As shown in FIG. 4, the rectangular wave current-applying device 30 has a rectangular wave current-generating circuit 31 which generates the rectangular wave current that flows through the zinc oxide elements 1, an upper electrode 32a and a lower electrode 32b for allowing the rectangular wave current supplied from the rectangular wave current-generating circuit 31 to the zinc oxide elements 1, an element-detecting sensor 36a which detects that the zinc oxide element 1 reached between the upper electrode 32a and the lower electrode 32b, a driving cylinder 34a and a driving cylinder 34b which move the upper electrode 32a and the lower electrode 32b, respectively, when the zinc oxide element 1 reaches a point between the electrodes 32a and 32b, a contact-detecting sensor 36b which detects when the electrode 32a contacted with the zinc oxide element 1 by the driving of driving cylinders 34a and 34b, a cylinder-controlling circuit 37 which controls the driving of the driving cylinders 34a and 34b, an insulator 33a and an insulator 33b which connect the electrodes 32a and 32b to the driving cylinders 34a and 34b to prevent a current from flowing to the driving cylinder side, and a frame 39 to which are fitted the driving cylinders 34a and 34b connected to the electrodes 32a and 32b through the insulators 33a and 33b.

Figure 8:
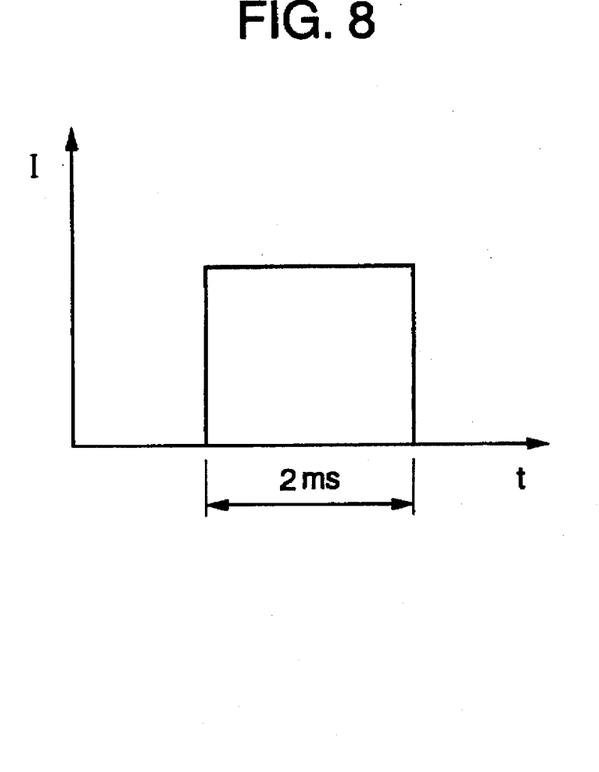
FIG. 8 is a graph showing a wave form of a current generated by a rectangular-wave generating circuit according to one example of the present invention.

The rectangular wave-generating circuit 31 generates a 2 ms rectangular wave current corresponding to the on-off surge discharge capability as shown in FIG. 8 and simultaneously determines the voltage applied to the zinc oxide element 1 when said rectangular wave current is allowed to flow therethrough. The upper electrode 32a and the lower electrode 32b are arranged above and below the roller 21 of the carrying device 20. The driving cylinder 34a for the upper electrode is provided above the upper electrode 32a and moves the upper electrode 32a downward, and the driving cylinder 34b for the lower electrode is provided below the lower electrode 32b and moves the lower electrode 32b upward. The electrodes 32a and 32b which move in this way are electrically connected to the rectangular wave current-generating circuit 31 through lead wires 35a and 35b. The element-detecting sensor 36a has a contact terminal and, when this contact terminal contacts with pin 13 of the pallet 10, the sensor detects that the zinc oxide element 1 reached the point between the upper electrode 32a and the lower electrode 32b. Furthermore, the contact-detecting sensor 36b has a contact terminal and when this contact terminal contacts with plate 38 provided at the insulator 33a, the sensor detects that the upper electrode 32a has contacted the zinc oxide element 1. Each of the sensors 36a and 36b are connected to the cylinder-controlling circuit 37 through a signal wire. When the element detecting sensor 36a detects the presence of the zinc oxide element 1, the cylinder-controlling circuit 37 drives simultaneously the driving cylinders 34a and 34b and, when the contact-detecting sensor 36b detects that the upper electrode 32a has contacted the zinc oxide element 1, the cylinder-controlling circuit 37 simultaneously stops the driving of the driving cylinders 34a and 34b.

Figure 6:
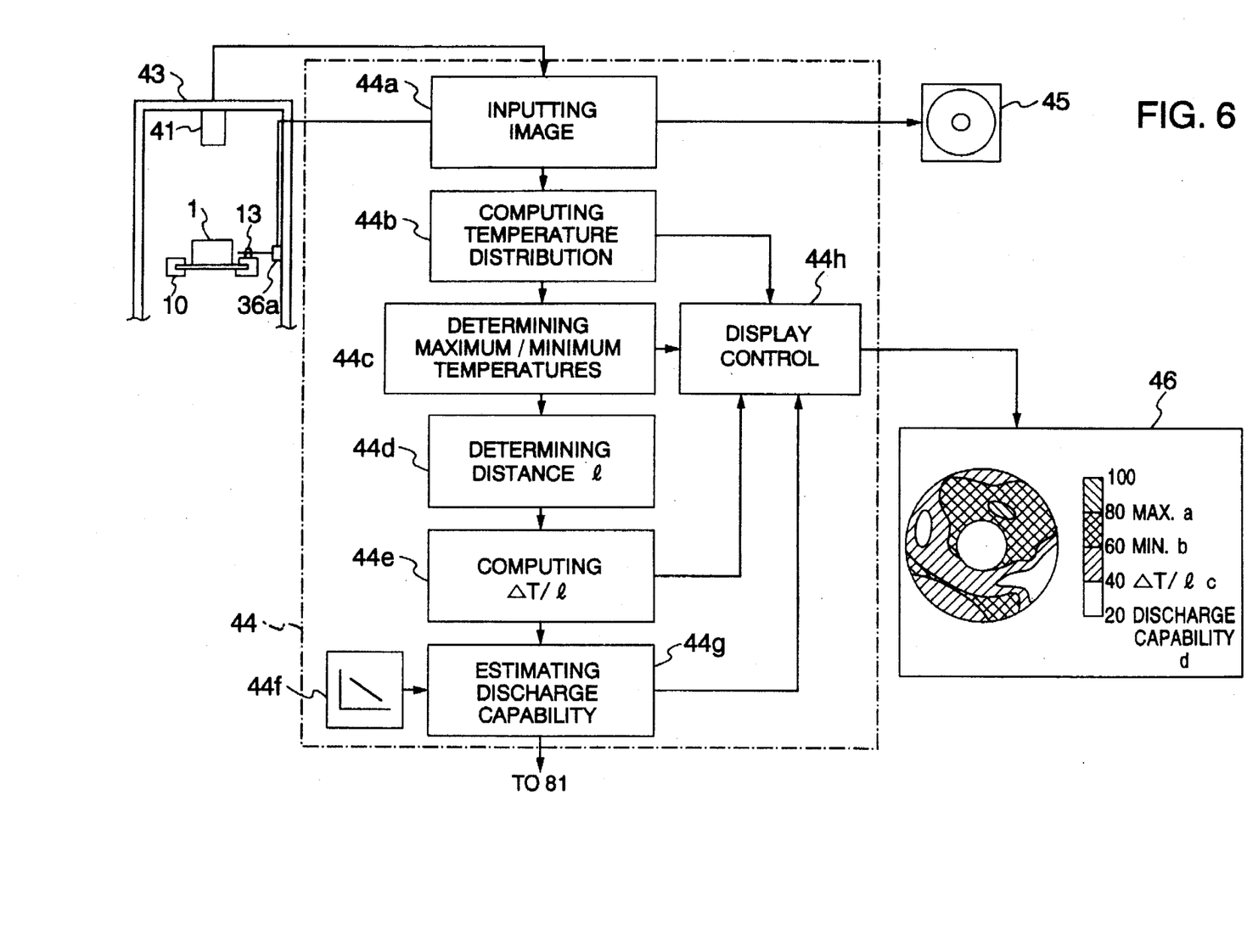
FIG. 6 is a functional a block diagram illustrating a system for estimating the discharge capability of zinc oxide elements according to one example of the present invention.

As shown in FIG. 6, the discharge capability-estimating device 40 has an infrared camera 41 which takes a photograph of the zinc oxide element 1 from about just after a rectangular wave current is applied to it by the rectangular wave current-applying device 30, a frame 43 which supports the infrared camera, an element-detecting sensor 36a which detects that the zinc oxide element 1 carried by the carrying device 20 has reached a point just below the infrared camera 41, a discharge capability-estimating computer 44 which estimates the discharge capability of the zinc oxide element 1 from the photograph of the image taken by the infrared camera 41, a magneto-optical disk device 45 which stores the photograph of the image taken by the infrared camera 41, and a display device 46 which displays the results of image processing conducted by the discharge capability estimating computer 44.

The discharge capability-estimating computer 44 has an image input part 44a as a functional element which inputs the image from the infrared camera 41 when the element-detecting sensor 36a detects the presence of the zinc oxide element 1, a temperature distribution-computing part 44b which obtains the temperatures of the respective 1 mm dots of the input image, a maximum temperature and minimum temperature-determining part 44c which determines the maximum temperature and the minimum temperature of the temperatures of the respective 1 mm dots obtained by the temperature distribution-computing part 44b, a distance-determining part 44d which determines the distance l between the maximum temperature point and the minimum temperature point determined by the maximum temperature and minimum temperature-determining part 44c, an index-computing part 44e which obtains a value obtained by dividing the difference $\Delta T$ between the maximum temperature $T_{max}$ and the minimum temperature $T_{min}$ by the distance l (hereinafter referred to as "index $\Delta T/l$"), a memory part 44f in which the relation between the index $\Delta T/l$ and the discharge capability is stored, a discharge capability-estimating part 44g which obtains the discharge capability from the relation memorized in the memory part 44f and the index $\Delta T/l$ obtained by the index-computing part 44e and a display-controlling part 44h which controls the content of the display of the display device 46.

Figure 9:
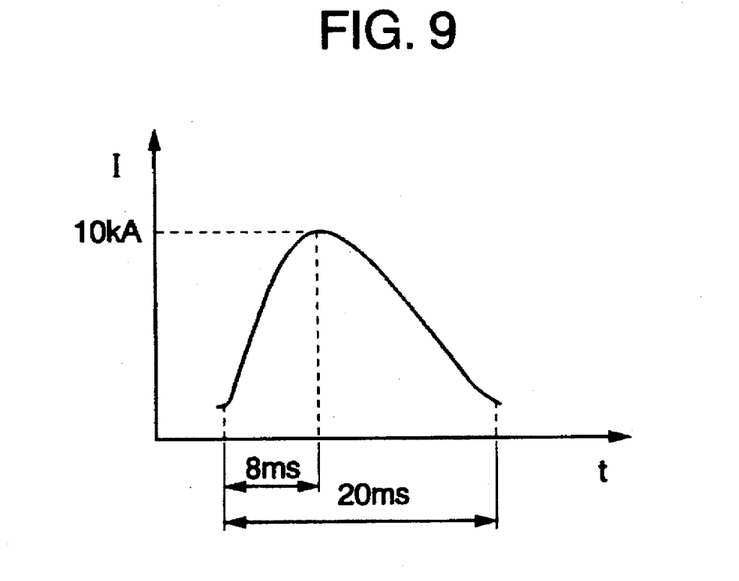
FIG. 9 is a graph showing a wave form of a current generated by a lightning impulse generating circuit according to one example of the present invention.

The limit voltage-determining device 50 has a lightning impulse-generating circuit 51 (shown in FIG. 1) which generates a lightning impulse current and is the same as the rectangular wave current-applying device 30 except that the lightning impulse-generating circuit 51 is substituted for the rectangular wave-generating device 31. The lightning impulse-generating circuit 51 generates a nominal discharge current 10 kA of the wave form as shown in FIG. 9. Specifically, it generates a current of such a wave form as having a maximum amplitude of 10 kA, a time required from rising to falling of the wave form, namely, a wave width of 20 ms and a time of 8 ms required for reaching the maximum amplitude from the rising of the wave. Furthermore, the lightning impulse-generating circuit 51 detects the voltage (limit voltage) applied to the zinc oxide element 1 when the nominal discharge current of 10 kA is generated.

The operating voltage-determining device 60 has a small current-generating circuit 61 which generates a small direct current and is the same as the rectangular wave current-applying device 30, except that the circuit 61 is substituted for the rectangular wave-generating device 31 of the device 30. The circuit 61 generates a direct current of 1 mA of various voltages and this is a circuit which can detect the voltage when this direct current of 1 mA is allowed to flow through the zinc oxide element 1 (operating voltage).

Figure 7:
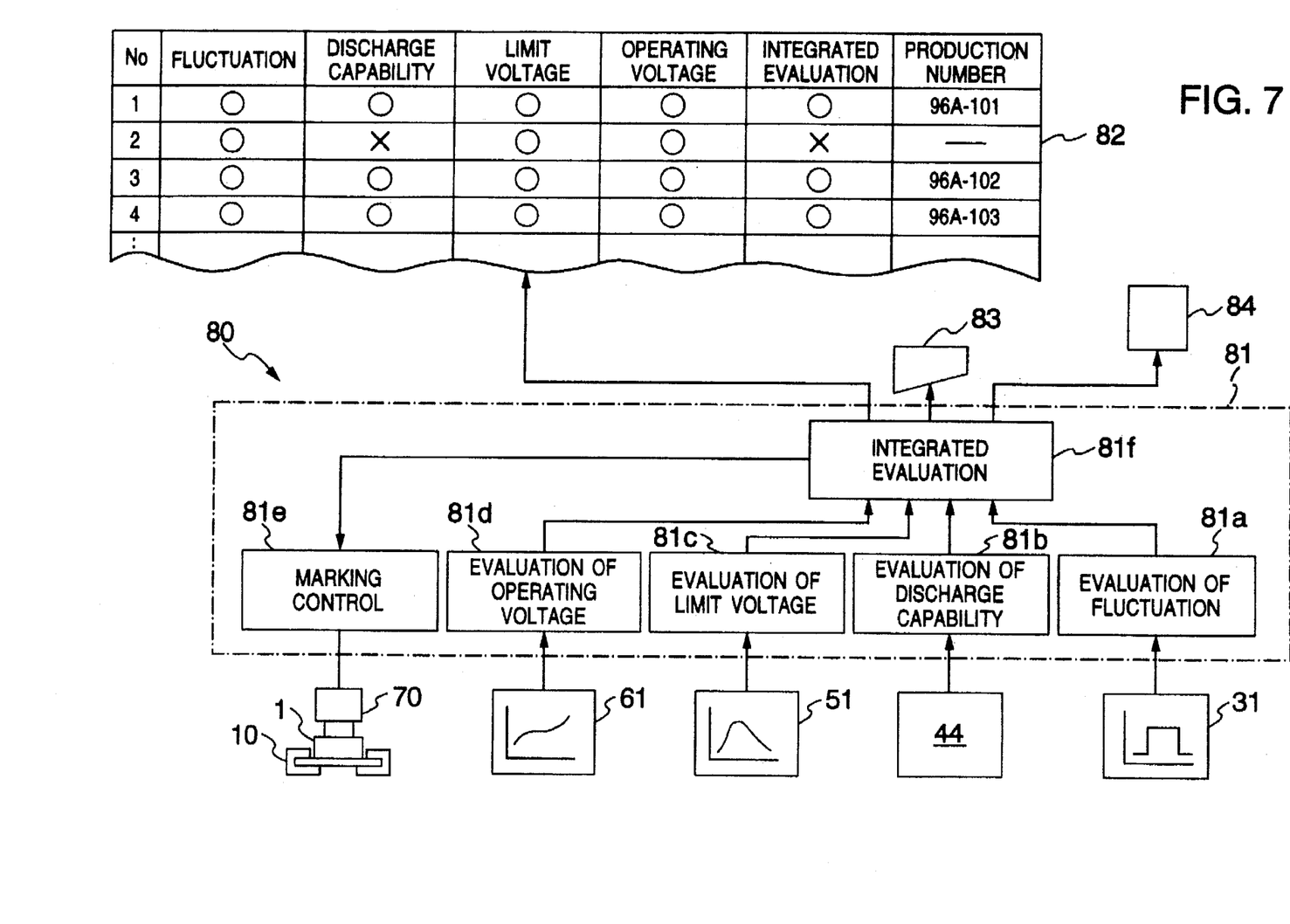
FIG. 7 is a functional a block diagram illustrating a control device of the zinc oxide element screening system according to one example of the present invention.

As shown in FIG. 1 and FIG. 7, the control device 80 has an evaluation computer 81 which judges the quality of the zinc oxide element 1 in various tests based on the signals supplied from the respective devices, a display device 82 which displays, for example, the results of judgement of the quality of the zinc oxide element 1, a printer 83 which prints out, for example, the results of judgement of the quality of the zinc oxide element 1, and a floppy disk device 84 which stores, for example, the results of judgement of the quality of the zinc oxide element 1.

As shown in FIG. 7, the evaluation computer 81 has evaluation parts 81a, 81b, 81c and 81d which evaluate the respective data transmitted from the respective devices, an integrated evaluation part 81f which collectively evaluates the results of evaluation at the respective evaluation parts, and a marking control part 81e which instructs the marking of a production number to the production number-marking device 70 when a specific zinc oxide element 1 is judged to be proper as a resistor of lightning arrestors. The evaluation parts include a voltage fluctuation-evaluating part 81a, which evaluates the degree of fluctuation of the voltage, based on whether or not the voltage applied to the zinc oxide element 1 when the rectangular wave-generating circuit 31 generates a rectangular wave current, falls within the previously determined range, a discharge capability-evaluating part 81b, which evaluates the estimated discharge capability, based on whether or not the discharge capability estimated by the discharge capability-estimating computer 44 is higher than the previously determined discharge capability, a limit voltage-evaluating part 81c, which evaluates the determined limit voltage, based on whether or not the limit voltage applied to the zinc oxide element 1, when the lightning impulse-generating circuit 51 generates a lightning impulse current, is lower than the previously determined limit voltage, and an operating voltage-evaluating part 81d, which evaluates the determined operating voltage, based on whether or not the operating voltage flowing through the zinc oxide element 1, when a direct current of 1 mA from the small current-generating circuit 61, is higher than the previously determined operating voltage.

In this example, computers 44 and 81 are provided exclusively by for the estimation of discharge capability and for the evaluation. This is because the discharge capability-estimating computer 44 carries out image processing and has a great processing load, and if a computer having a performance that is able to easily carry out the image processing is used, this one computer may carry out the discharge capability estimation and the evaluation. The discharge capability-estimating system specified in the claims given hereinafter has the rectangular wave current-applying device 30 and the discharge capability-estimating device 40 in this example.

Next, operation of the screening system of this example will be explained.

Operators put three zinc oxide elements 1 on each of a plurality of pallets 10 and place them on the delivery table 24 of the carrying device 20. Then, the pallets 10 on the delivery table 24 are successively moved to the beginning part of the carrying route of the carrying device 20. When the pallet 10 is put on the driving rollers 21a, 21a, 21a at the beginning part, the pallet 10 moves downstream. The pallet 10 which has moved to the downstream side is pushed by the pallet 10 on the upper stream side and further moves downstream. When the element 1 on the carrying route has reached a specific device, the driving rollers 21a, 21a, 21a stop for 15 seconds and, thereafter, drive until the element on one upper stream side reaches a specific device. The dwell time of 15 seconds is a time for which each device provided along the carrying route can securely carry out the desired processing of the element 1.

Figure 5:
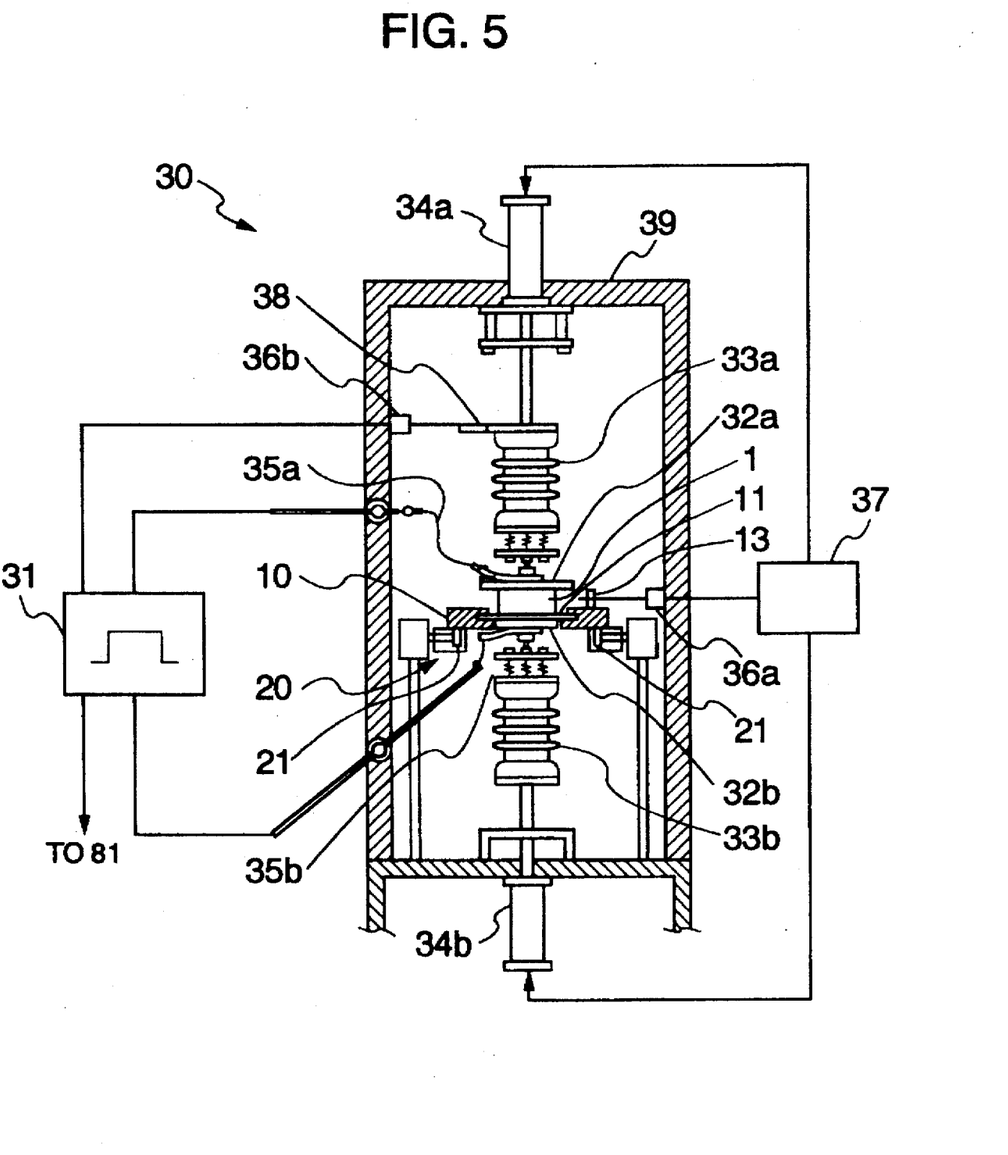
FIG. 5 is a side view of a rectangular wave-flowing device (closed state) of the zinc oxide element screening system according to one example of the present invention.

As shown in FIG. 4, when the element 1 on the pallet 10 reaches the point between the electrodes 32a and 32b of the rectangular wave current-applying device 30, the pallet 10 stops and pin 13 of the pallet 10 contacts the element-detecting sensor 36a. When sensor 36a contacts pin 13 of the pallet 10 and determines that the element 1 reaches the point between electrodes 32a and 32b, the sensor 36a transmits the determination to cylinder controlling circuit 37. Upon receiving it, the cylinder-controlling device 37 drives the driving cylinders 34a and 34b. As shown in FIG. 5, when the upper electrode 32a falls by the driving of upper electrode driving cylinder 34a and contacts the element 1 and the lower electrode 32b rises by the driving of lower electrode driving cylinder 34b and contacts the metal plate 11 of the pallet 10, the contact-detecting sensor 36b detects the contact to drive the rectangular wave-generating circuit 31. As explained above using FIG. 8, a rectangular wave current of 2 ms corresponding to the on-off surge discharge capability flows from the rectangular wave-generating circuit 31 to the element 1 through the electrodes 32a and 32b and the metal plate 11.

Then, the operators visually examine whether cracks occur or not in the element 1 and, thus, ascertain whether or not the element 1 can stand the on-off surge discharge current. The operators exclude the elements 1 in which cracks have occurred.

The rectangular wave-generating circuit 31 generates a rectangular wave current and simultaneously detects the voltage applied to the element 1 when this current is allowed to flow through the element 1 and sends this voltage value to the evaluation computer 81 of the control device 80. The voltage fluctuation-evaluating part 81a of the evaluation computer 81 decides whether or not the voltage value detected by the rectangular wave-generating circuit 31 is within the predetermined range and judges the element 1 to be "acceptable" with respect to voltage fluctuation if the voltage value is within the range and judges the element 1 to be "unacceptable" with respect to voltage fluctuation if the voltage value is outside the range. The results of this judgement are sent to the integrated evaluation part 81f. As mentioned in the prior art, when zinc oxide elements 1 are used in lightning arrestors, many of them are connected and used in this state. Therefore, even if an element 1 is excellent in its performance, it should be avoided that a large load is concentrated to this element or substantially no load is applied to this element. Therefore, in this example, the voltage applied to element 1 when a specific current is allowed to flow therethrough is detected and it is decided whether or not this voltage value is within the predetermined range and the element outside this range is excluded.

When a rectangular wave current of 2 ms corresponding to the on-off surge discharge capability is allowed to flow through element 1, the temperature of this element 1 rises in accordance with its heat capacity (about 2.7 J/cm$^3$·° C.). Specifically, if the element temperature before allowing a current to flow through the element is about 20° C., it rises to about 60° C.

When the passing of the rectangular wave current through the element 1 is completed, the pallet 10 begins to move until the element 1 on one upper stream side reaches the electrodes 32a and 32b.

When the element 1 through which a rectangular wave current flowed to generate heat comes just under infrared camera 41 of the discharge capability estimating device 40, the pallet 10 stops again. The infrared camera 41 takes a photograph of the element 1 positioned just under the camera. The image of the element 1 photographed by the infrared camera 41 is input in the image-inputting part 44a of the discharge capability-estimating computer 44 and simultaneously is stored in the magneto-optical disk device 45. The temperature distribution-computing part 44b carries out the calculation of the temperature of the image data for every 1 mm dot and obtains the temperature for every point of the element 1. In this case, in order that the same temperature display as a black-body point can be performed, the image data on the aluminum electrode of the zinc oxide element having an emissivity of 0.24 is converted to those corresponding to a black-body point having an emissivity of 0.98. The maximum temperature and minimum temperature-determining part 44c determines the maximum temperature and the minimum temperature among the temperatures for every 1 mm dot obtained by the temperature distribution-computing part 44b. The distance-determining part 44d obtains the distance l between the maximum temperature point and the minimum temperature point. The index-computing part 44e obtains the index ΔT/l by dividing the difference ΔT between the maximum temperature Tmax and the minimum temperature Tmin by the distance l. From the relation between the discharge capability and the index (shown in FIG. 10) stored in memory part 44f, the discharge capability estimating part 44g obtains the discharge capability corresponding to the index ΔT/l obtained by the index-computing part 44e. In this case, the display device 46 displays the temperature distribution of element 1 (converted to one corresponding to black-body point) and further displays the maximum temperature Tmax, the minimum temperature Tmin, the index ΔT/l and the discharge capability as shown in FIG. 6. Therefore, the operator can immediately know the temperature distribution and the discharge capability of the element 1 from the displayed content. The obtained discharge capability is sent to the discharge capability-evaluating part 81b of the evaluating computer 81 and is judged there whether it is higher than the predetermined one, and if the estimated discharge capability is higher than the predetermined one, the discharge capability-evaluating part 81b judges the element 1 to be "acceptable" with respect to discharge capability and if the estimated discharge capability is lower than the predetermined one, it judges the element 1 to be "unacceptable". This result of judgement is sent to the integrated evaluation part 81f of the evaluation computer 81.

Figure 10:
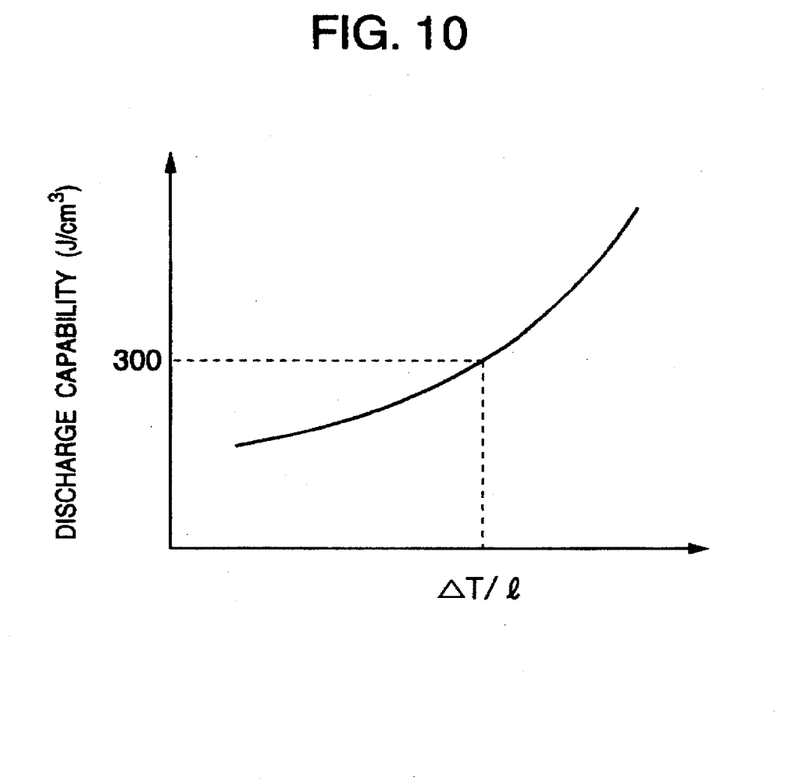
FIG. 10 is a graph showing a relation between an index (ΔT/l) and a discharge capability according to one example of the present invention.
Figure 12:
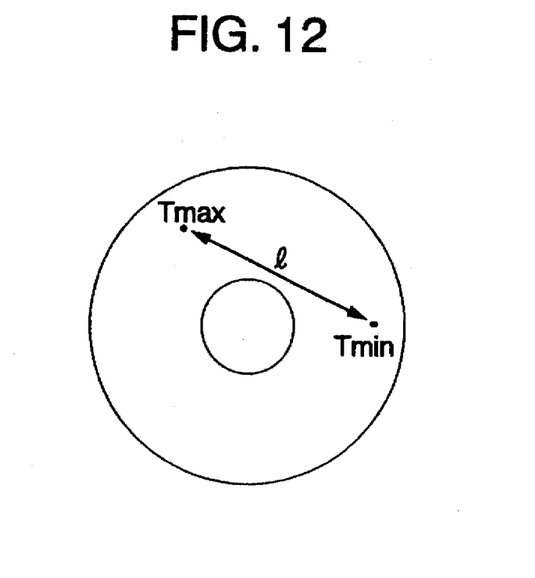
FIG. 12 is a diagram explaining how to obtain the index ((ΔT/l) according to one example of the present invention.
Figure 13:
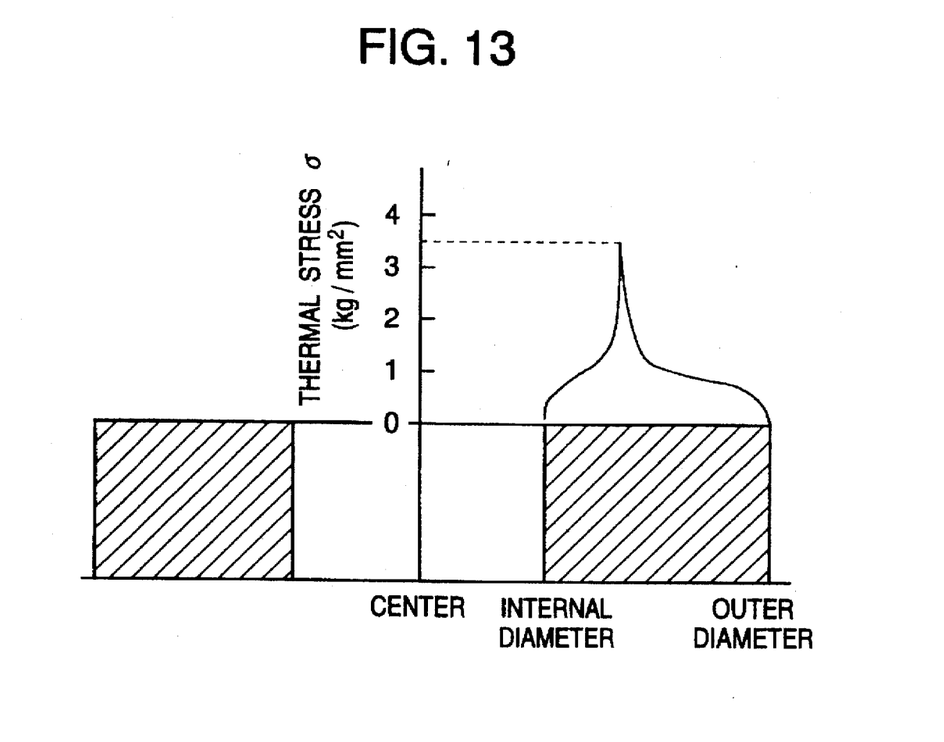
FIG. 13 is a diagram explaining how thermal stress is generated in a zinc oxide element under a deviated temperature distribution in the zinc oxide element.

As mentioned in the "prior art" above, since the microstructure of zinc oxide element 1 is apt to become non-uniform, when a given energy is applied to the element to generate heat, a uniform temperature distribution is not obtained to produce a deviation. For this reason, as shown in FIG. 13, a thermal stress is locally concentrated and if this exceeds the breaking limit of the element 1, cracks occur. Therefore, if the tendency of the thermal stress generated in the element 1 when a given energy is applied can be determined, it can be determined whether the element 1 can endure or not when a certain energy is applied, namely, the discharge capability of the element 1 can be determined. Accordingly, in this example, as shown in FIG. 12, when a given energy is applied to element 1, the maximum temperature point and the minimum temperature point are determined and the temperature difference ΔT is divided by the distance l between the points to obtain the index ΔT/l which is a temperature gradient of the element 1 which shows the tendency of the thermal stress, and the discharge capability is obtained based on this index. When the discharge capability is obtained based on the index, the relation between the index ΔT/l and the discharge capability shown in FIG. 10 is previously stored in the memory part 44f of the computer 44 and the discharge capability is obtained from the index ΔT/l using the relation.

In this example, since the energy injected into the element 1 is a 2 ms rectangular wave current corresponding to the on-off surge discharge capability, the discharge capability is obtained from the relation between the discharge capability and the index when the 2 ms rectangular wave current corresponding to the on-off surge discharge capability is allowed to flow, but when merely the discharge capability is obtained without carrying out the test on whether the element 1 can endure the on-off surge discharge, it is not necessary to allow the 2 ms rectangular wave current corresponding to the on-off surge discharge capability to flow and, for example, a current of a lower energy level is allowed to flow, and the discharge capability may be obtained from the relation between the index and the discharge capability when the current of this level is allowed to flow.

Figure 11:
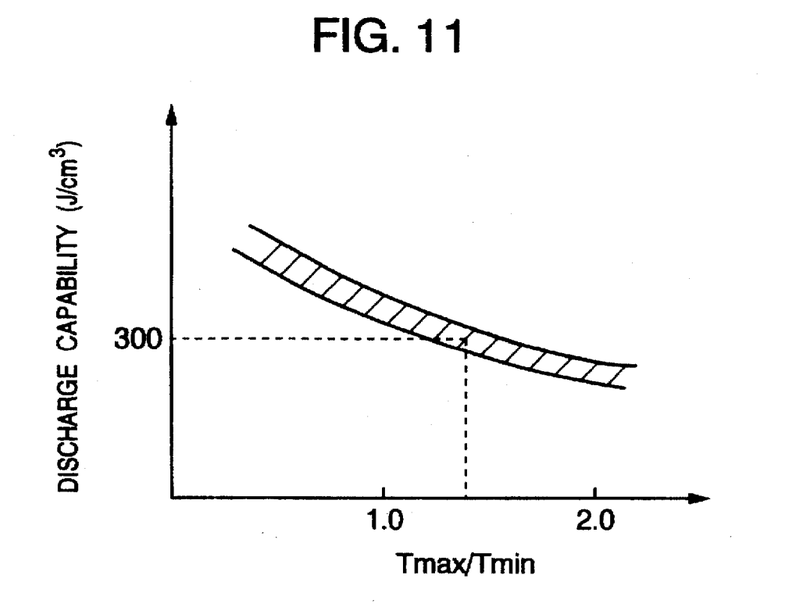
FIG. 11 is a graph showing a relation between an index (Tmax/Tmin) and a discharge capability according to one example of the present invention.

Furthermore, in this example, the index (ΔT/l) is used for showing the tendency of thermal stress, but since the ratio of the maximum temperature Tmax and the minimum temperature Tmin (Tmax/Tmin) also shows the tendency of thermal stress, the discharge capability can also be obtained by previously obtaining the relation between the index (Tmax/Tmin) and the discharge capability as shown in FIG. 11. However, when the ratio of the maximum temperature Tmax and the minimum temperature Tmin (Tmax/Tmin) is used as the index, this is inferior in accuracy of the obtained discharge capability to the case of using ΔT/l as the index since the distance l between them is not taken into consideration and the temperature gradient of element 1 is not accurately determined. On the other hand, when the discharge capability is obtained by using Tmax/Tmin as the index, it is not necessary to obtain the distance l between the maximum temperature point and the minimum temperature point by the distance-determining part 44d after the maximum temperature point and the minimum temperature point were determined by the maximum temperature and minimum temperature-determining part 44c of the computer 44, and immediately the Tmax/Tmin may be obtained by the index-computing part 44e and, thus, the load of the computer 44 can be diminished.

When the element 1 of which the discharge capability was obtained reaches the limit voltage-determining device 50, a lightning impulse current of nominal discharge current 10 kA shown in FIG. 9 is allowed to flow through element 1 from lightning impulse-generating circuit 51 of the limit voltage-determining device 50 and the voltage (limit voltage) applied to the element 1 at this time is measured. The thus measured limit voltage value is sent to the limit voltage-evaluating part 81c of the evaluation computer 81. The limit voltage-evaluating part 81c judges whether this limit voltage value is lower than the predetermined value or not and if this is lower than the predetermined value, it judges the element 1 to be "acceptable" with respect to the limit voltage and if the limit voltage value is higher than the predetermined value, it judges the element 1 to be "unacceptable" with respect to the limit voltage. This result of judgement is sent to the integrated evaluation part 81f.

When the element 1 of which the limit voltage was determined reaches the operating voltage-determining device 60, a direct current of 1 mA is allowed to flow from small current generating circuit 61 of the operating voltage-determining device 60 and the voltage (operating voltage) applied when this direct current of 1 mA is allowed to flow through zinc oxide element 1 is determined. The thus determined operating voltage value is sent to the operating voltage-evaluating part 81d of the evaluation computer 81. The operating voltage-evaluating part 81d judges whether this operating voltage value is higher than the predetermined value or not and if this is higher than the predetermined value, it judges the element 1 to be "acceptable" with respect to the operating voltage and if the operating voltage value is lower than the predetermined value, it judges the element 1 to be "unacceptable" with respect to the operating voltage. This result of judgement is sent to the integrated evaluation part 81f.

Figure 14:
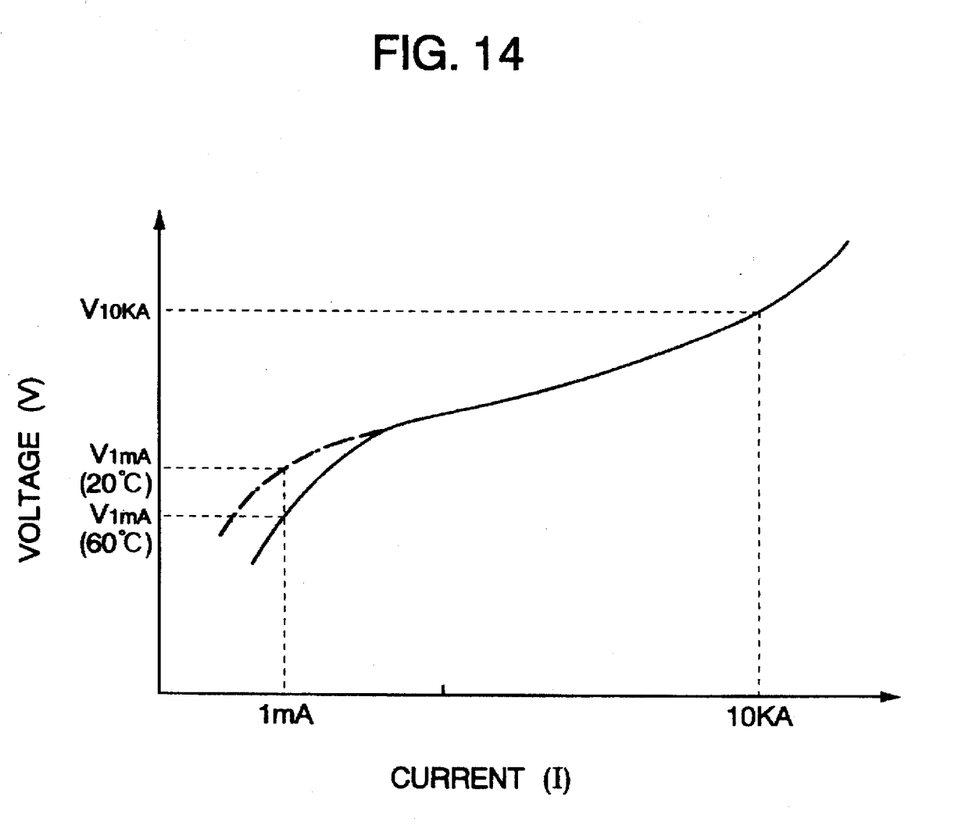
FIG. 14 is a graph showing a relation between the current flowing through a zinc oxide element and the voltage.

As shown in FIG. 14, since zinc oxide element 1 has negative characteristics on temperature, namely, decreases in its resistivity upon rising in temperature, when the operating voltage is determined under the conditions where the temperature rises by applying the rectangular wave current or lightning impulse current, the value obtained is smaller than the value before the rising of the temperature. When the operating voltage is determined after application of the rectangular wave current or the lightning impulse current, the operating voltage can be evaluated under the severer conditions. Especially, as in this example, when the temperature of element 1 is raised to about 60° C., there is the merit that the operating voltage can be measured under the conditions at an environmental temperature set at 60° C.

After completion of evaluation on the operating voltage, the integrated evaluation part 81f of the evaluation computer 81 decides whether the element 1 has been judged to be "acceptable" with respect to all of the evaluations: the voltage fluctuation, the discharge capability; the limit voltage, and the operating voltage; and when all the evaluations have been judged to be "acceptable", the integrated evaluation part 81f transmits instructions with carry out marking to the marking control part 81e, and when either one of them is judged to be "unacceptable", it transmits instructions not to carry out marking with the marking control part 81e. Upon receiving the instructions to carry out marking, the marking control part 81e determines the production number of the element 1 and transmits this production number to production number marking device 70.

When the element 1 of which the operating voltage has been measured reaches the production number marking device 70, the marking device 70 marks the number only on the elements 1 which are "acceptable" in all evaluations and does not mark at all the other elements 1 in accordance with the instructions from the marking control part 81e of the evaluation computer 81.

As shown in FIG. 7, "acceptable" or "unacceptable" on the respective evaluation items, "acceptable" or "unacceptable" on the integrated evaluation, the production number and so on are displayed in the display device 82 of the control device 80. These displayed contents can also be printed out from printer 83.

According to the present invention, the discharge capability of zinc oxide elements can be numerically determined. Therefore, the quality of zinc oxide elements can be accurately judged.

What is claimed is:

1. A method of estimating the discharge capability of a zinc oxide element, which comprises:

previously obtaining a relation between a discharge capability of the zinc oxide element and an index value obtained by dividing a difference between a maximum temperature and a minimum temperature of the zinc oxide element through which a current of a given energy quantity is allowed to flow to generate heat, by a distance between a maximum temperature point and a minimum temperature point, allowing a current of said given energy quantity to flow through the zinc oxide element, determining the maximum temperature and the minimum temperature of the surface of the zinc oxide element through which said current is allowed to flow to generate heat and simultaneously determining the distance between the maximum temperature point and the minimum temperature point, obtaining the index by dividing a difference between the determined maximum and minimum temperatures by the determined distance, and obtaining the discharge capability of the zinc oxide element using the obtained index and the previously obtained relation.

2. A method of screening a zinc oxide element by judging whether a zinc oxide element is proper for use as a resistor in a lightning arrestor or not, said method comprising:

estimating the discharge capability of the zinc oxide element by the estimating method of claim 1, allowing a nominal discharge current required by the zinc oxide element as a resistor of a lightning arrestor to flow through the zinc oxide element and determining a limit voltage applied to the zinc oxide element, determining an operating voltage applied to the zinc oxide element when a small current of a previously determined value is allowed to flow through the zinc oxide element, and judging the zinc oxide element as being proper for a resistor of the lightning arrestor when the estimated discharge capability is greater than the previously determined discharge capability, the determined limit voltage is lower than the previously determined limit voltage and the determined operating voltage is higher than the previously determined operating voltage.

3. A method according to claim 1, wherein after a current of a given energy quantity is allowed to flow through the zinc oxide element and the maximum temperature and the minimum temperature on the surface of the zinc oxide element are determined, a limit voltage is determined and, then, an operating voltage is measured.

4. A system for estimating discharge capability of a zinc oxide element, which comprises;
- an energy-injecting means which allows a current of a given energy quantity to flow through a zinc oxide element,
- a photographing-means which takes a photograph of a zinc oxide element after heat is generated by allowing the current to flow through the zinc oxide element,
- a temperature distribution-computing means which obtains a surface temperature distribution of the zinc oxide element from the photograph of the zinc oxide element taken by the photographic means,
- a maximum temperature and minimum temperature-determining means which determines a maximum temperature and a minimum temperature of temperatures of various parts of the zinc oxide element which are obtained by the temperature distribution-computing means,
- a distance-determining means which determines a distance between a point of the maximum temperature and a point of the minimum temperature,
- an index-computing means which obtains an index value obtained by dividing the difference between the maximum temperature and the minimum temperature determined by the maximum and minimum temperature-determining means by the distance determined by the distance-determining means,
- a memory means for storing a relation between the discharge capability of the zinc oxide element and the index value, and
- a discharge capability-estimating means which obtains the discharge capability corresponding to the index obtained by the index-computing means using the relation memorized in the memorizing means.

5. A system according to claim 4, which has an output means which outputs the temperature distribution of the zinc oxide element obtained by the temperature distribution-computing means and the discharge capability obtained by the discharge capability estimating means.

6. A system for screening a zinc oxide element by judging whether a zinc oxide element is proper or not as a resistor used in a lightning arrestor which comprises:
- a device for estimating discharge capability according to any of claims 4 or 5,
- a limit voltage-determining device which allows a nominal discharge current required for the zinc oxide element to be used as a resistor of a lightning arrestor to flow through the zinc oxide element and determines a limit voltage applied to the zinc oxide element,
- an operating voltage-determining device which determines an operating voltage applied to the zinc oxide element when a small current of a previously determined value is allowed to flow through the zinc oxide element,
- a discharge capability-evaluating means which judges the zinc oxide element to be acceptable or unacceptable on the discharge capability depending on whether or not the discharge capability estimated by the discharge capability-estimating apparatus is greater than the previously determined discharge capability,
- a limit voltage-evaluating means which judges the zinc oxide element to be acceptable or unacceptable on the limit voltage depending on whether or not the limit voltage measured by the limit voltage-determining device is lower than the previously determined limit voltage,
- an operating voltage-evaluating means which judges the zinc oxide element to be acceptable or unacceptable on the operating voltage depending on whether or not the operating voltage determined by the operating voltage-determining device is higher than the previously determined operating voltage or not, and
- an integrated evaluation means which judges the zinc oxide element as being proper for a resistor of the lightning arrestor only when the zinc oxide element is judged to be acceptable by the respective evaluation means.

7. A screening system according to claim 6, which is provided with a marking device which marks the zinc oxide element when the zinc oxide element is judged as being proper for a resistor of the lightning arrestor by the integrated evaluation means.

8. A screening system according to claim 6, which is provided with a carrying device which carries the zinc oxide element so that the zinc oxide element can be processed with the discharge capability-estimating apparatus, the limit voltage-determining device, and the operating voltage determining device in this order.

9. A screening system according to claim 7, which is provided with a carrying device which carries the zinc oxide element so that the zinc oxide element can be processed with the discharge capability-estimating apparatus, the limit voltage-determining device, the operating voltage-determining device and the marking device in this order.

10. A screening apparatus according to claim 6, wherein the energy-injecting means of the discharge capability-estimating device allows a current to flow through the zinc oxide element, which current corresponds to the on-off surge discharge capability required for the zinc oxide element as a resistor of the lightning arrestor.

11. A screening apparatus according to claim 6, which is provided with an evaluation result-outputting means which outputs the results of evaluation by the respective evaluation means.

* * * * *